United States Patent [19]
Botti et al.

[11] Patent Number: 5,444,417
[45] Date of Patent: * Aug. 22, 1995

[54] SELF-CONFIGURABLE, DUAL BRIDGE, POWER AMPLIFIER

[75] Inventors: Edoardo Botti, Vigevano; Guido Brasca, Varese, both of Italy

[73] Assignee: SGS-Thomson Microelectronics S.A., Gentilly, France

[*] Notice: The portion of the term of this patent subsequent to Nov. 15, 2011 has been disclaimed.

[21] Appl. No.: 286,706

[22] Filed: Aug. 5, 1994

Related U.S. Application Data

[63] Continuation of Ser. No. 192,858, Feb. 7, 1994, Pat. No. 5,365,188.

[30] Foreign Application Priority Data

Feb. 24, 1993 [EP] European Pat. Off. .......... 93830070

[51] Int. Cl.$^6$ .............................................. H03F 3/68
[52] U.S. Cl. .................................. 330/51; 330/124 R; 330/146; 330/295
[58] Field of Search ............... 330/51, 84, 124 R, 146, 330/295

[56] References Cited

U.S. PATENT DOCUMENTS

| | | |
|---|---|---|
| 3,944,941 | 3/1976 | Tsuda . |
| 4,494,077 | 1/1985 | Fukaya . |
| 5,101,170 | 3/1992 | Torazzina et al. ............... 330/146 X |
| 5,194,821 | 3/1993 | Brambilla et al. ..................... 330/51 |

FOREIGN PATENT DOCUMENTS 2452854 10/1980 France ........................... H05K 1/02

*Primary Examiner*—James B. Mullins
*Attorney, Agent, or Firm*—Wolf, Greenfield & Sacks

[57] ABSTRACT

A self-configurable, dual bridge, power amplifier has a window comparator to sense amplifier signals and control a plurality of configuring switches capable of configuring the amplifier either as a single bridge amplifier driving two loads connected in series or as two distinct bridge amplifiers each driving one of the two loads. When the two amplifier signals remain within a range defined by a negative voltage reference and a positive voltage reference, the amplifier is configured as a single bridge driving the two loads in series, thus reducing power dissipation. Several embodiments of the invention are shown.

33 Claims, 9 Drawing Sheets

SELF-CONFIGURABLE, DUAL BRIDGE, POWER AMPLIFIER

This application is a continuation of application Ser. No. 08/192,858 filed Feb. 7, 1994, now U.S. Pat. No. 5,365,188.

BACKGROUND OF THE INVENTION

1. Field of the Invention

The present invention relates to a self-configurable, dual bridge, power amplifier and more particularly to a self-configurable, dual bridge, power amplifier having considerably reduced consumption relative to conventional dual bridge amplifiers having the same output power rating.

2. Discussion of the Related Art

In many applications and particularly in audio equipment, low frequency, power amplifiers that drive the loudspeakers very often use a bridge configuration. In a bridge configuration such as an integrated amplifier, for example, it is possible to achieve an output power rating of about 20 W. In contrast, an output power rating of about 5 W could be obtained by the same integrated amplifiers in a single-ended configuration.

Furthermore, the output power stages of car radios or of comparable audio systems often have four "channels": right-front, left-front, right-rear and left-rear which enable uniform sound diffusion throughout the compartment by adjusting each channel's attenuation.

Four, 20 W, power amplifiers may produce maximum power dissipation of about 48 W (4×12 W). Because of the required compactness of car radios and similar audio systems, effective power dissipation is difficult to achieve due to relatively high internal temperature generated within the apparatus. Additionally, high working temperature may be detrimental to a magnetic tape cassette or an optical compact disk (CD) contained within the drive cabinet of the audio apparatus.

From the above considerations, it is clear that there is a need or utility for a bridge amplifier which can provide substantially reduced power dissipation for a particular maximum power delivered to multiple external loads.

SUMMARY OF THE INVENTION

The above noted technical problems are substantially overcome by the circuit of the present invention based on a dual bride amplifier composed of four operational power amplifiers, which are connectable in either a first or a second configuration. In the first configuration, the functional circuit is equivalent to that of a single bridge amplifier driving a load equivalent to a first and to a second load, connected in series. In the second configuration, the circuit is functionally equivalent to that of two distinct bridge amplifiers, the first amplifier and the second amplifier driving the first load and the second load, respectively. A window comparator, i.e., a comparator having a dual threshold, generates a configuring signal for the four power amplifiers of either configuration, depending on the instantaneous value of the signals fed to two input terminals of the amplifier. The configuring devices may have a pair of switches, a single pole switch and a two-pole switch, respectively, driven by the signal generated by the window comparator. Furthermore, each switch may be functionally implemented with a plurality of monopolar switches, driving in phase opposition among each other by the comparator signal. Control of these switches may be achieved by employing the comparator in combination with driving inverters where necessary.

Basically, when the level of the signals fed to the two inputs of the window comparator have an amplitude that remains within the "window", as determined by the two threshold voltages of the comparator, i.e., by a negative threshold voltage and by a positive threshold voltage, the output signal of the comparator controls the positioning of the configuration elements and configures the amplifier as a single bridge amplifier driving a first and a second load connected in series. When the instantaneous value of at least one of the input signals rises above a certain pre-established (absolute) level, the comparator changes state and causes the positioning of the configuring switches to two distinct bridge amplifiers, the first and second amplifiers driving the first and second loads, respectively. It is evident that as long as the instantaneous level of the signals remains within the "window" of the comparator, the dissipation remains equal to about a quarter of the dissipation of two distinct bridge amplifiers driving distinct loads. Therefore, a net decrease of the working dissipation of the dual bridge amplifier is achieved.

BRIEF DESCRIPTION OF THE DRAWINGS

The different aspects and advantages of the invention will become more evident through the following description of several important embodiments and by referring to the circuit diagrams shown in the attached drawings, wherein.

For purely illustrative purposes, the self-configurable dual bridge amplifier shown in the figures may represent a power audio amplifier of one of two stereo channels of an audio amplifier. The input signals that are fed to the two terminals IN-F and IN-R of the amplifier shown in the figure, may be substantially the same signals, eventually attenuated differently in order to drive a front and a rear channel, of one stereo channel. Nevertheless, the signals may also be different, although the maximum increase of efficiency, in terms of a reduced power dissipation, is obtained when the input signals as well as the loads that are represented in the figures by the two F and R (front and rear) loudspeakers are identical.

DETAILED DESCRIPTION

Figure 1:
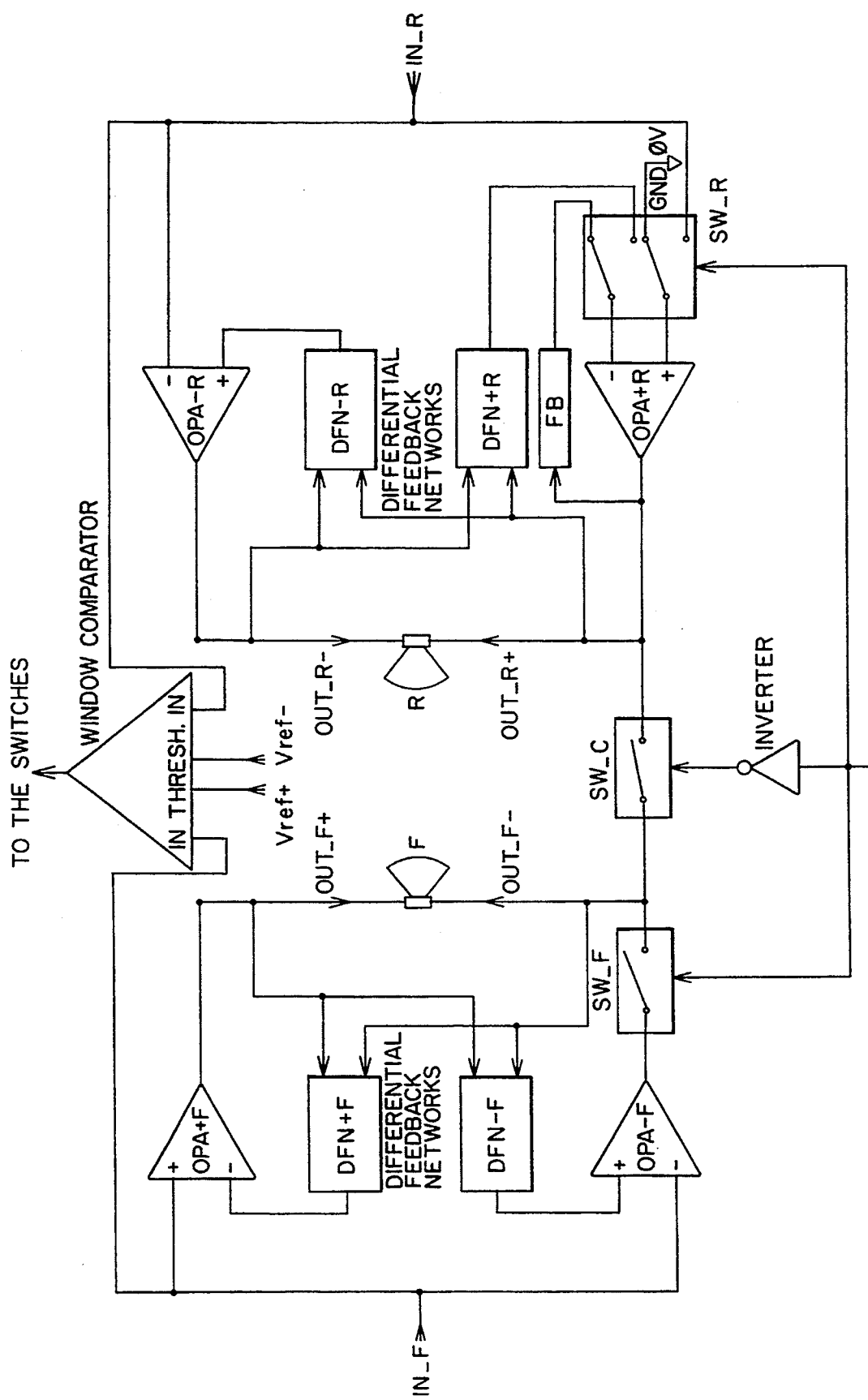
FIG. 1 is a functional block diagram of a self-configurable, dual bridge amplifier of the present invention.

The block diagram of FIG. 1 shows, in a schematic fashion, a self-configurable, dual bridge amplifier, made according to the present invention. Essentially the dual bridge amplifier of the invention comprises four power operational amplifiers: OPA+F, OPA−F and OPA−R, OPA+R. Each power amplifier is provided with its own differential feedback loop in accordance with a common practice, namely: DFN+F, DFN−F and DNF−R, DNF+R, respectively. The dual bridge amplifier further comprises a window comparator (WINDOW COMPARATOR), which drives a plurality of configuring switches, namely: SW−F, SW−C and SW−R.

The fourth power operational amplifier OPA+R is provided with an alternatively selectable, second feedback loop, permitting the amplifier to be configured as a buffer (unitary gain). Alternatively, this second feedback loop may be configured to use the first differential feedback loop DFN+R of the same amplifier, by positioning the configuring switches driven by the window comparator.

In strictly functional terms, the configuring elements may include a two-pole switch (SW−R) and a single-pole power switch, which in the functional diagram of FIG. 1 are represented by two power switches, namely SW−F and SW−C, driven in phase opposition by employing an inverter for driving the second (SW−C) of the two power switches. This second power switch (SW−C) connects in series the two loads that are represented by the two loudspeakers F (for example the front-right loudspeaker) and R (for example the rear-right loudspeaker), respectively.

Essentially, the dual threshold comparator (window comparator) changes state (i.e., changes the logic level of the signal present on its output node) as a function of the instantaneous value of the signals that are fed to the two inputs of the comparator. In the embodiment shown in FIG. 1, the signals that are applied to the inputs of the configuring comparator are the same signals that are fed to the two inputs IN−F and IN−R of the amplifier. If the amplifier is implemented as the output stage of one of two stereo channels, the two input signals may be substantially identical to each other. The two signals may be attenuated differently from one another, for example by means of a dedicated control knob of the apparatus, that adjusts and optimize sound distribution in a certain interior. The dual triggering thresholds of the comparator, for instantaneous positive values and negative values, respectively, of the input signals, may be preset by applying two reference voltages: Vref+ and Vref−, which determine the respective thresholds of the comparator.

Figure 2:
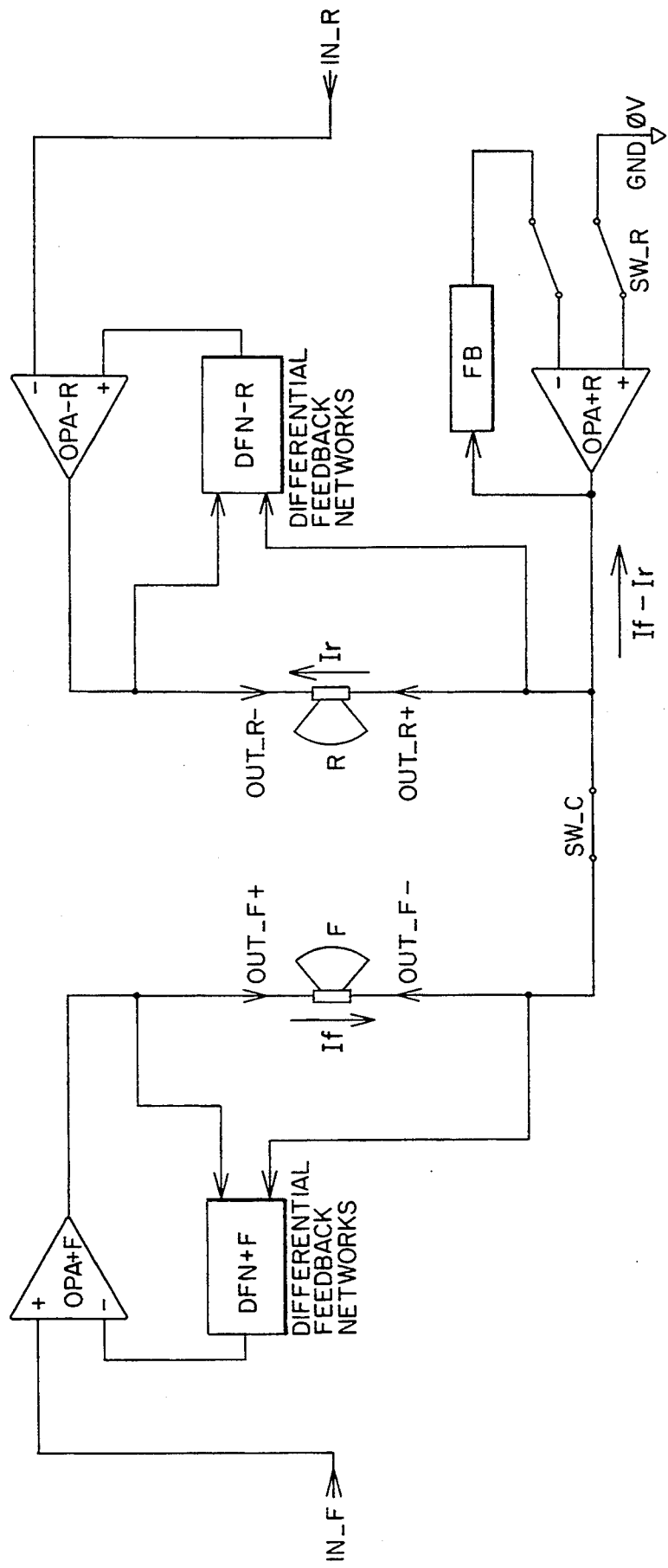
FIG. 2 is a functional diagram of the amplifier configured as a single bridge amplifier driving a load that is equivalent to a first load and a second load connected in series.

As long as the amplitude of the input signals remains within the "window" determined by the positive and negative thresholds (Vref+ and Vref−), the configuring elements will remain positioned so as to configure the functional circuit of the dual bridge amplifier as shown in FIG. 2.

In this configuration, when the signals that are fed to the inputs IN−F and IN−R of the amplifier are identical, the differential feedback lines and the operational power amplifiers are such that the signal generated on the output terminal OUT−F+ has the same amplitude and an opposite sign as the signal that is generated on the output terminal OUT−R−. Moreover, the fourth operational amplifier, OPA+R, functions substantially as a buffer, having its output node kept at ground potential, while the operational amplifier OPA−F (re: FIG. 1), is practically inactive (practically inexistent) because the switch SW−F is open.

In practice, the power switch SW−F connected to the output of the operational power amplifier OPA−F may be substantially eliminated and its function of "isolating" the respective operational power amplifier OPA−F may be virtually and conveniently performed by placing the amplifier in a state of a high output impedance, i.e., in a so-called tri-state condition.

In any case, in the configuration of FIG. 2 as assumed by the self-configurable, dual bridge amplifier of FIG. 1, the current that flows through the load F also feeds the load R.

Any difference in the current absorbed by the two loads is eventually absorbed by the buffer-configured operational amplifier OPA+R. Of course, if the loads and the signals are identical the difference of current absorbed by the two loads, namely: If-Ir will be virtually null. Therefore, under these conditions, the dissipated power will be equivalent to that of a single bridge amplifier driving a load having an impedance given by the following relation:

$$\text{Requiv.} = (R_F + R_R)$$

wherein RF and RR are the internal resistances of the two loads F and R. This dissipated power is equal to a quarter of the power that would be dissipated by two distinct bridge amplifiers driving the same loads.

Figure 3:
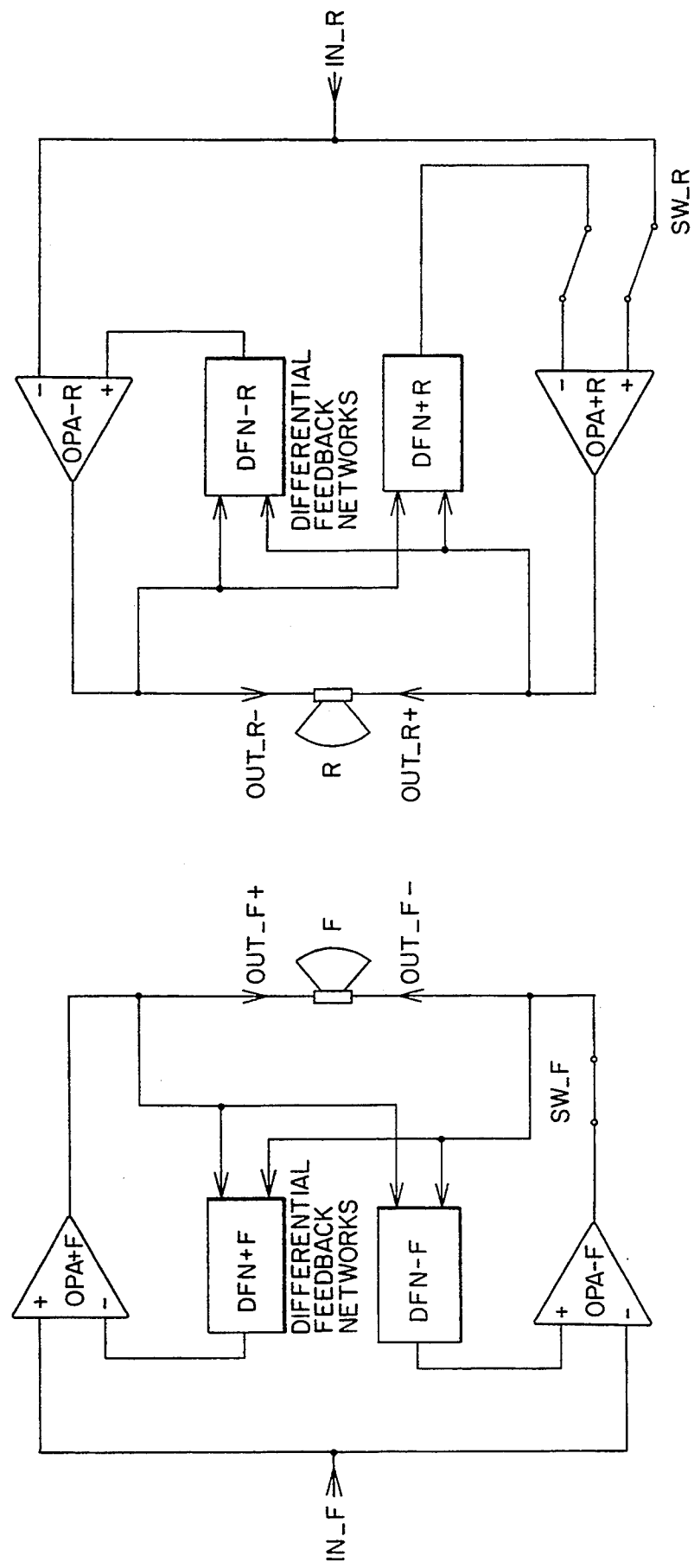
FIG. 3 is a functional diagram of the amplifier of the invention configured as two distinct bridge amplifiers, each driving one of the loads.

When the level of either of the two input signals reaches a value beyond either of the two thresholds (Vref+ and Vref−) that define the "window" of the comparator, the configuring elements change state thus determining a configuration of the circuit as depicted in FIG. 3, which represents a normal dual bridge configuration, wherein two, essentially distinct, bridge amplifiers drive their respective loads.

As may be observed from the functional diagrams, the differential feedback of the power operational amplifiers is derived from a load-connection node so that the gain will remain substantially constant notwithstanding a change of configuration. Moreover, an eventual nonlinearity of the power switch SW−C (FIG. 1) will not induce distortion effects.

Although the dual threshold comparator (WINDOW COMPARATOR) that drives the configuring elements (SW−F, SW−C and SW−R) is subject to output state transitions depending on the instantaneous amplitude of the signals fed to the inputs of the amplifier, this does not imply necessarily that the signals fed to the inputs of the amplifier be fed also to the inputs of the comparator. An alternative embodiment of the invention is depicted in the block diagram of FIG. 4, wherein the signals that are actually fed to the inputs of the configuring comparator (window comparator) are derived from the respective connection nodes of the loads F and R, instead of from the input nodes IN−F and IN−R of the amplifier. This alternative embodiment may be appropriate when the feedback lines DFN+F and DFN−R are insensitive to direct coupling with the input nodes of the comparator.

Figure 4:
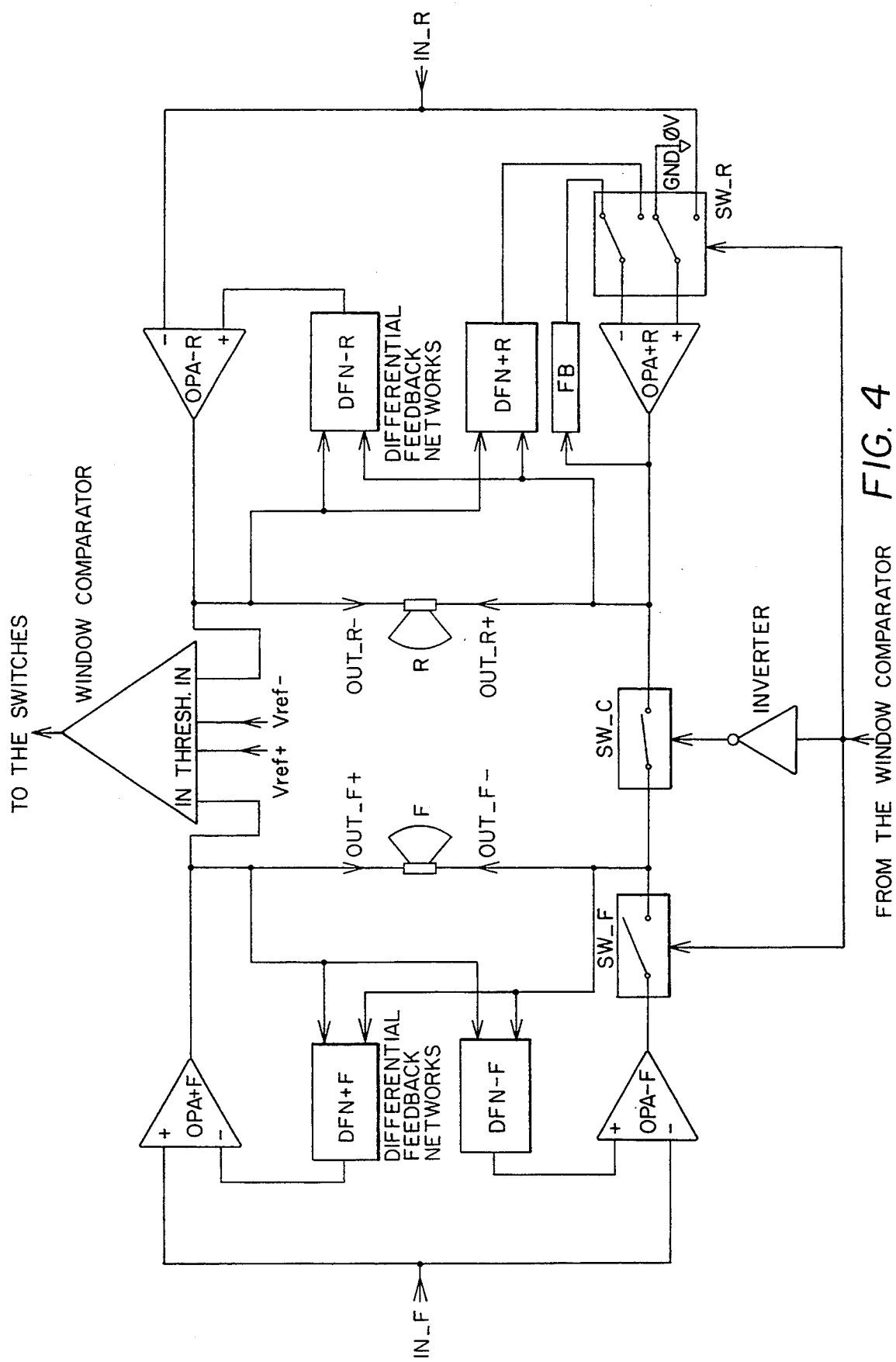
FIG. 4 shows an alternative embodiment of a self-configurable, dual bridge amplifier of the invention wherein the configuring window comparator uses the signals of the output nodes of the amplifiers rather than the signals of the input nodes thereof.
Figure 5:
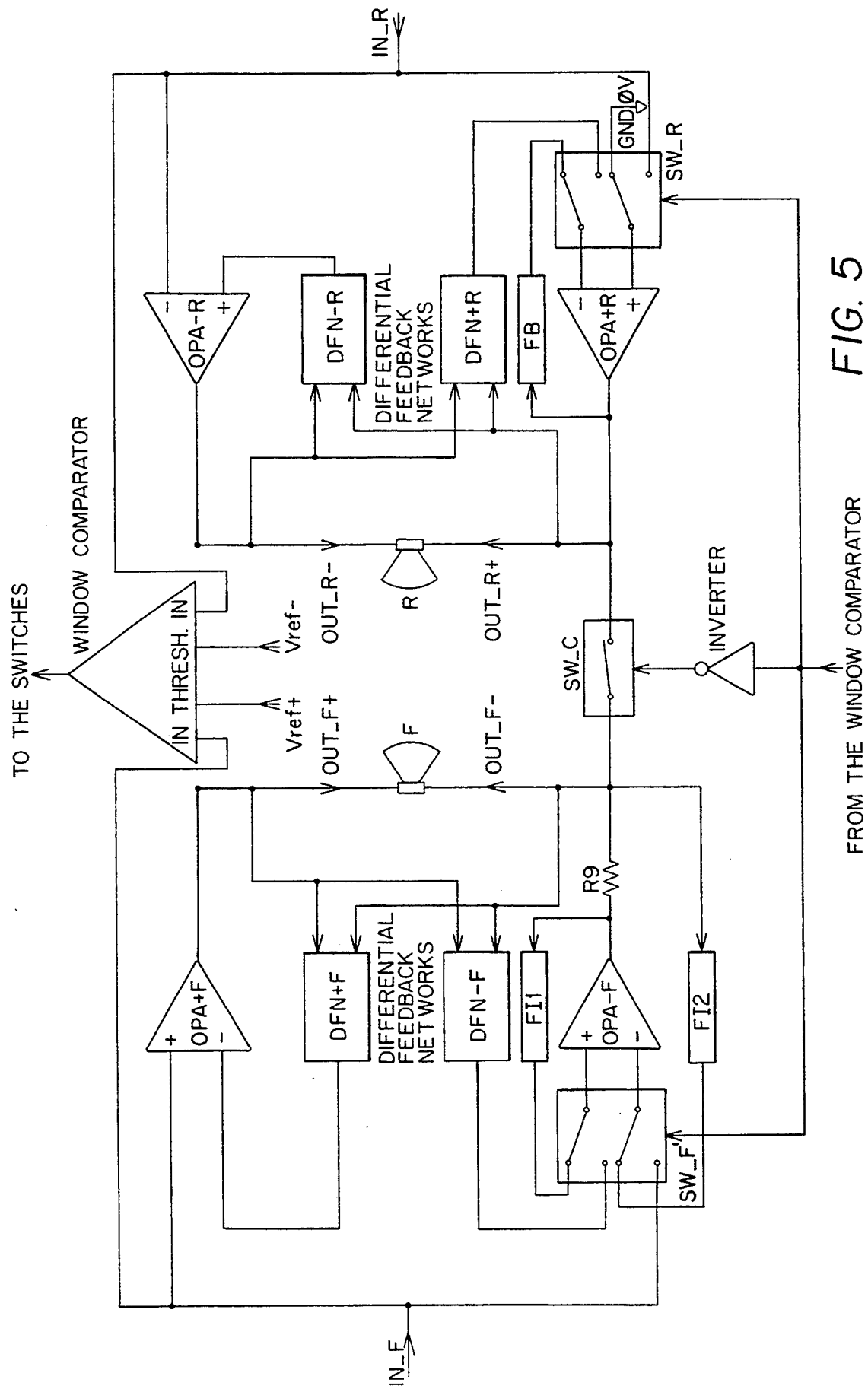
FIG. 5 is a block diagram of an alternative embodiment of the self-configurable, dual bridge amplifier of the invention.

FIG. 5 shows a functional diagram of another embodiment of the invention, wherein, the function of the power switch SW_F of the functional diagrams of FIGS. 1 and 4, does not require the integration of a power device (typically a power MOS transistor) for implementing the switch SW_F. Moreover, this alternative embodiment, does not require the use of an operational amplifier (OPA−F) incorporating a circuit capable of determining a so-called "tri-state" condition of operation, i.e., a condition of a high output impedance.

This important result is obtained by connecting a resistance R9 having a relatively low value, in series to the output of the operational amplifier OPA−F and by realizing two buffer feedback networks: FI1 and FI2, that are connected to the output of the amplifier OPA−F, before and after, respectively, the series resistance R9. A two-pole switch SW_F', driven by the signal generated by the configuring comparator, switches the inputs of the operational amplifier OPA−F to said buffer feedback lines when the instantaneous level of the input signals of the amplifier remains within the "window" determined by the two reference voltages (positive and negative) Vref+ and Vre− applied to the comparator.

Figure 6:
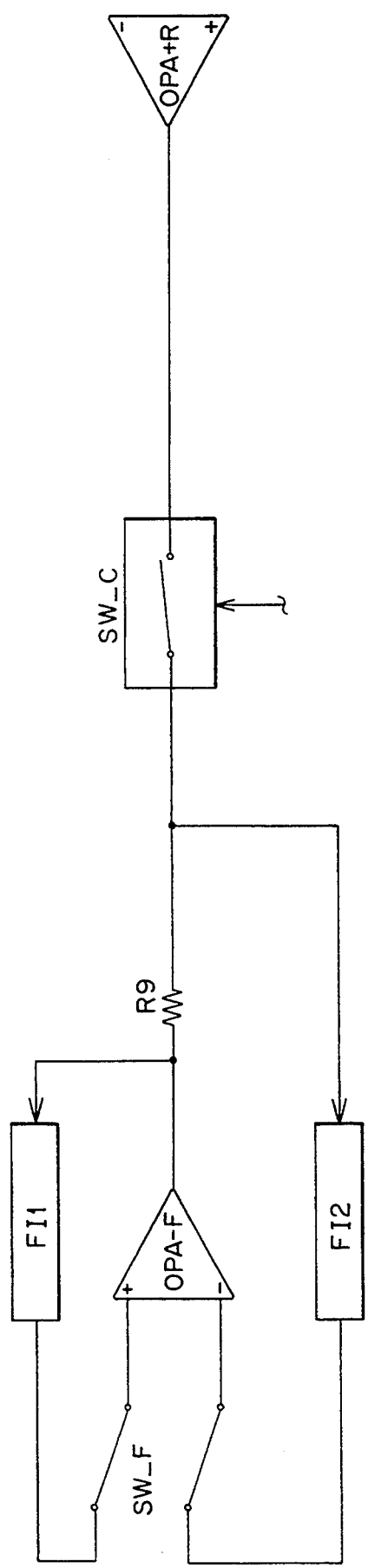
FIG. 6 is a partial block diagram showing the operation of the peculiar self-configuring system of the amplifier of FIG. 5.

In this condition, the operational amplifier OPA−F is configured as shown in the partial diagram of FIG. 6.

In this configuration, the operational amplifier OPA−F is normally powered, but because of the feedback loops connected to the output node of the amplifier before and after the series connected resistance R9 (having a relatively low value, for example 0.1 2), the current that the amplifier may deliver through its output is virtually null ($\approx$ Voffset/R9). Therefore, the potential assumed by the output node is substantially determined by the rest of the circuit, i.e., by the other operational amplifier OPA+R and by the switch SW_C.

Figure 7:
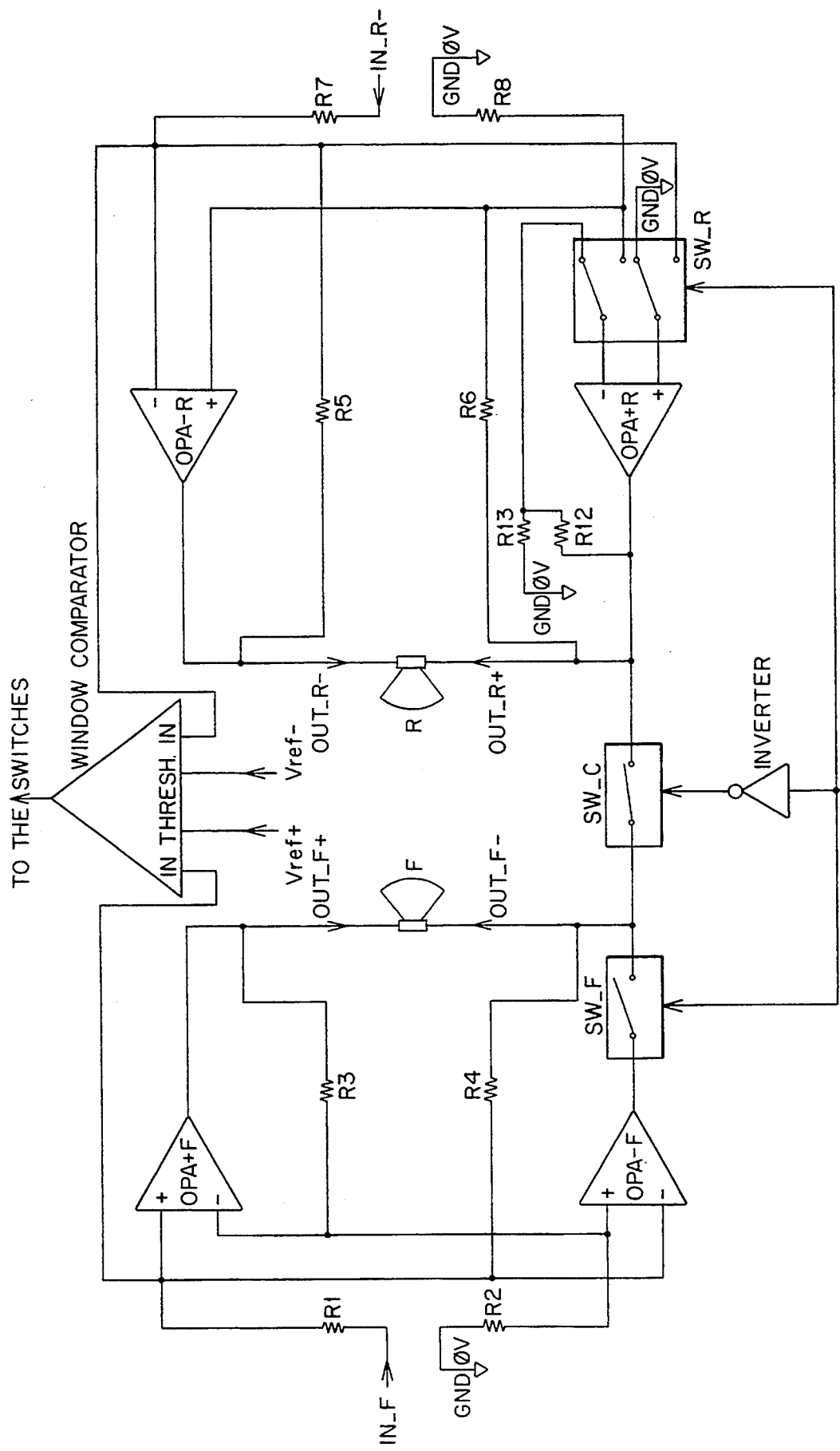
FIG. 7 is a diagram of the amplifier of FIG. 1, wherein selectable feedback loops of the amplifiers are shown in detail.

A circuit diagram of the diagram of FIG. 1, is shown in FIG. 7, wherein an embodiment of the feedback lines of the four operational power amplifiers is shown.

Figure 8:
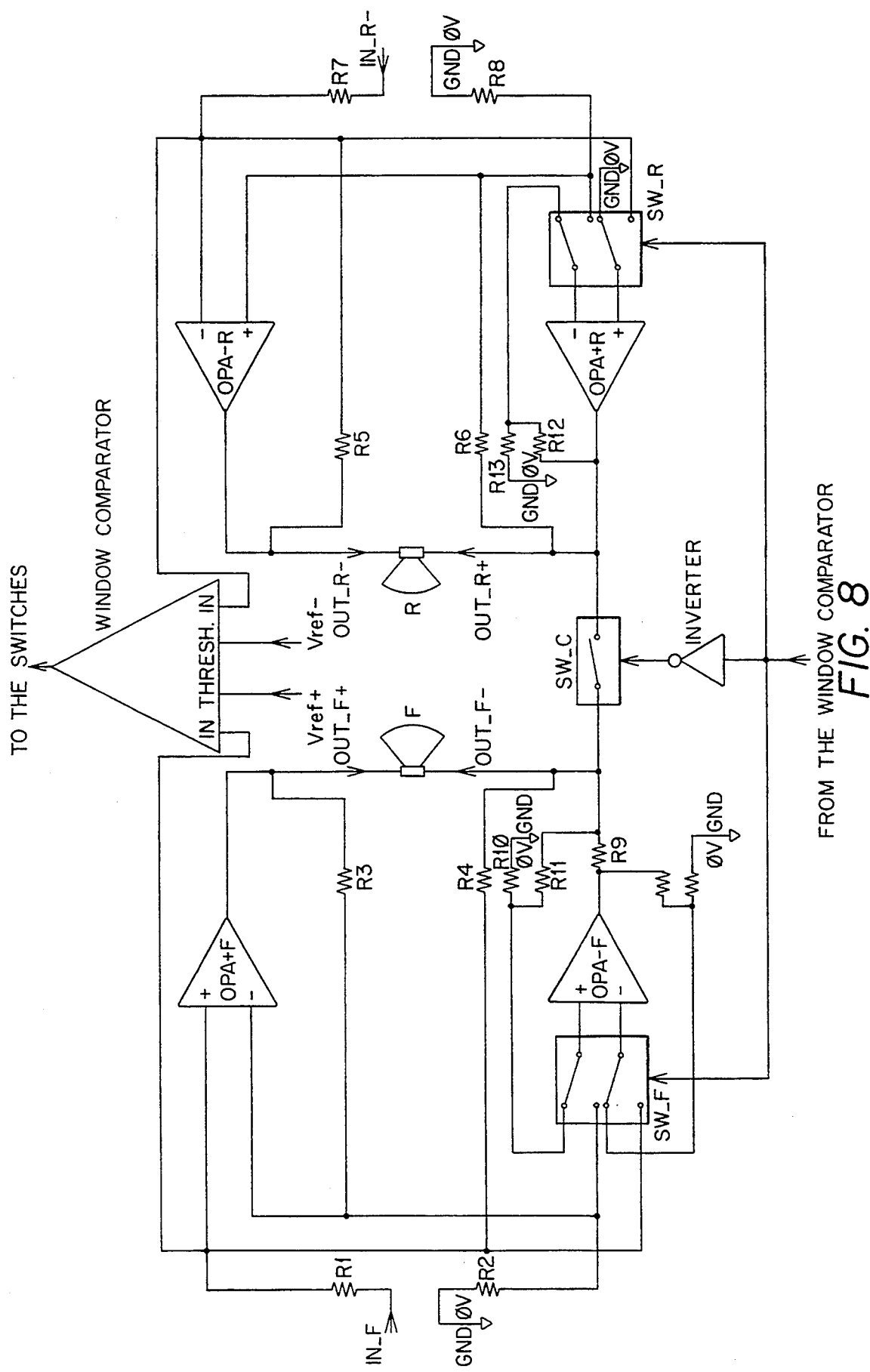
FIG. 8 shows the circuit of the amplifier of FIG. 5, wherein the feedback loops of the four power amplifiers are shown in detail.

A circuit diagram of the diagram of FIG. 5 is shown in FIG. 8, wherein the feedback lines of the four operational power amplifiers are shown in detail.

Figure 9:
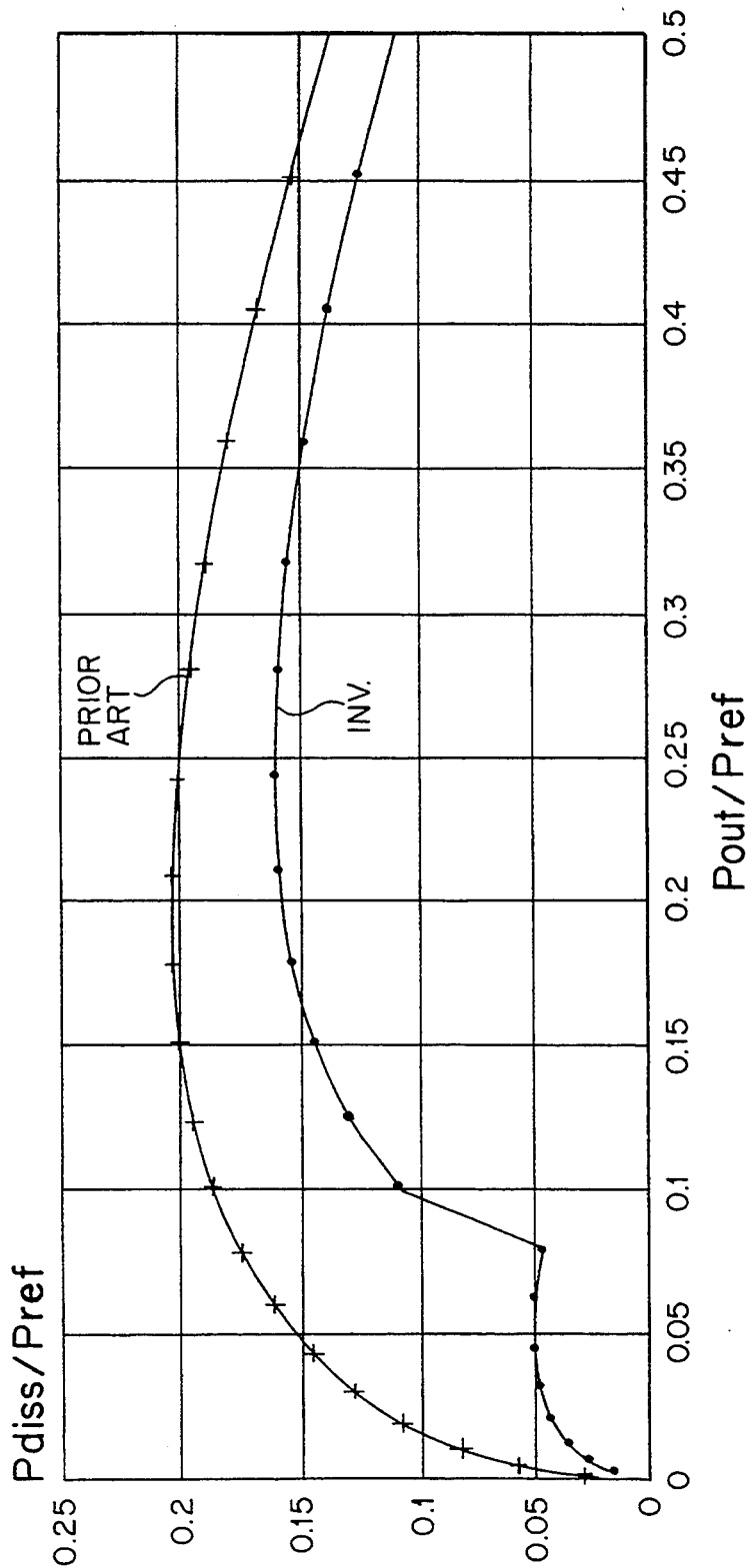
FIG. 9 shows a normalized diagram of the power dissipation in function of the output power of a self-configurable, dual bridge amplifier of the invention and of a comparable dual bridge amplifier, made according to the prior art.

The reduction of the dissipated power provided by a self-configurable, dual bridge amplifier of the present invention as compared to a dual bridge amplifier of functionally identical characteristics, but without the self-configuring system of the invention, is graphically shown in FIG. 9. Normalized diagrams of the power dissipation in function of the output power in the case of a conventional type dual bridge amplifier (prior art) and in the case of a self-configurable amplifier of the invention (INV) are shown in the figure.

The self-configurable, dual bridge amplifier of the invention may be entirely integrated and essentially does not require the use of additional components that cannot be integrated, such as large capacitors.

Of course, a self-configurable, dual bridge amplifier made in accordance with the present invention may also be provided with common mode feedback loops, in accordance with techniques and practices that are well known to a person skilled in the art.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is limited only as defined in the following claims and the equivalents thereto.

What is claimed is:

1. A dual bridge amplifier comprising a first operational amplifier, a second operational amplifier, a third operational amplifier and a fourth operational amplifier connectable in one of a first configuration comprising a single bridge amplifier including said first amplifier and said second amplifier driving a load comprised of a first load and a second load connected in series and a second configuration comprising a first bridge amplifier and a second bridge amplifier wherein said first bridge amplifier includes said first operational amplifier and said third operational amplifier and said second bridge amplifier includes said second operational amplifier and fourth operational amplifier, respectively, each driving one of said first and second loads, and comprising further a window comparator for generating a configuration signal for configuring said four amplifiers in one of said first configuration and in said second configuration, in function of the instantaneous value of input signals that are fed respectively to a first input terminal and a second input terminal of the dual bridge amplifier, by controlling a plurality of configuring means driven by said configuring signal.

2. A self-configurable amplifier according to claim 1, wherein said configuring means are electronic switches.

3. A self-configurable amplifier as defined in claim 2, wherein said window comparator generates said configuring signal driving a two pole switch capable of commuting the inputs of said fourth operational amplifier, a first power switch capable of isolating the output of said third operational amplifier and, through an inverter, a second power switch capable of connecting in series said two loads.

4. A self-configurable amplifier as defined in claim 3, wherein said two-pole switch commutes the inputs of said fourth amplifier from a connection to a respective input terminal of the amplifier and to a differential feedback line, functional to a configuration of the amplifier as one of two distinct bridge amplifiers, to a connection to ground and to a buffer feedback line, and a single bridge amplifier configuration.

5. A self-configurable amplifier according to claim 2, wherein said electronic switches functionally implement a first two-pole switch capable of commuting the inputs of said fourth amplifier, a second two-pole switch capable of commuting the inputs of said third amplifier and a single-pole power switch capable of connecting in series said first load and said second load.

6. A self-configurable amplifier as defined in claim 5, wherein said second two-pole switch commutes the inputs of said third amplifier from a connection to a respective input terminal of the amplifier and to a differential feedback line, functional to one of a configuration as two distinct bridge amplifiers, to a connection to a first and to a second buffer feedback lines, respectively connected across a series resistance connected to the output node of the amplifier, and a single bridge amplifier configuration.

7. A self-configurable amplifier as defined in claim 1, wherein each of said four operational amplifiers has a differential feedback line.

8. A method of reducing power dissipation in a double bridge amplifier comprising the steps of:
generating a configuring signal in response to a plurality of instantaneous values of signals fed to the amplifier;
driving by said generated signal a plurality of configuring means that configure the amplifier as a single bridge amplifier that drives a plurality of loads when the instantaneous value of the input signals are within a window defined reference voltages, and as two distinct bridge amplifiers, each driving one of the loads of the plurality of loads, when the instantaneous value of at least one of the input signals is outside the window defined by said reference voltages.

9. A self-configurable amplifier for driving a first load and a second load comprising:
a plurality of means for amplifying a signal, each means for amplifying a signal being capable of driving a load; means for connecting one of a load, a means for amplifying, a voltage source and a ground to one of another load, another means for amplifying, the voltage source, and the ground; and
means for controlling the means for connecting to create selectively
a first configuration wherein the first load and the second load are connected in series by the means for connecting, and two means for amplifying drive the loads, and
a second configuration wherein the first load is driven by two means for amplifying and the second load is driven by two other means for amplifying.

10. A self-configurable amplifier as defined in claim 9 wherein the means for connecting includes a plurality of resistances constructed and arranged to produce a feedback connection for each means for amplifying.

11. A self-configurable amplifier as defined in claim 10 wherein the means for controlling includes a window comparator and a plurality of switches connecting the loads, feedback connections and two amplifier inputs; wherein the window comparator has a high threshold voltage and a low threshold voltage, receives two inputs, and outputs a control signal to the plurality of switches.

12. A self-configurable amplifier as defined in claim 11 wherein one of the switches in the means for controlling is a two-pole switch that selectively connects a means for amplifying to a feedback connection and to a ground in the first configuration and to a feedback connection and an amplifier input in the second configuration.

13. A self-configurable amplifier as defined in claim 11 wherein one of the switches in the means for controlling selectively isolates the first load from the second load in the second configuration so that each load is driven independently by different means for amplifying.

14. A self-configurable amplifier as defined in claim 10 wherein the plurality of means for amplifying includes a first means for amplifying, a second means for amplifying, a third means for amplifying and a fourth means for amplifying;
the means for connecting includes at least one feedback connection for each means for amplifying and a plurality of connections among the means for amplifying, the loads and the means for controlling; and the means for controlling controls the means for connecting so that the first configuration has the first means for amplifying and the second means for amplifying driving the first load and second load in series, and
the second configuration has the first means for amplifying and the third means for amplifying driving the first load independently of the second means for amplifying and the fourth means for amplifying driving the second load.

15. A method for reducing power dissipation in a double bridge amplifier wherein a first load is driven by a first operational amplifier and a third operational amplifier and a second load is driven by a second operational amplifier and a fourth operational amplifier comprising the steps of:
receiving two input signals by a controller;
determining if either input signal is within a predetermined voltage threshold;
sending an output signal from the controller a plurality of switches, and
configuring the double bridge amplifier as a single bridge amplifier wherein the first load is in series with the second load by selectively opening and closing each switch.

16. A method for reducing power dissipation in a double bridge amplifier as defined in claim 15 wherein the step of configuring further includes the steps of disconnecting the third operational amplifier, driving the loads using the first operational amplifier and the second operational amplifier and using the fourth operational amplifier as a buffer at ground potential.

17. A method for reducing power dissipation in a double bridge amplifier as defined in claim 16 wherein the step of driving the loads using the first operational amplifier and second operational amplifier further comprises the step of using the third operational amplifier to absorb a difference in a rate of first current flowing through the first load and a second current flowing through the second load.

18. A method for reducing power dissipation in a double bridge amplifier as defined in claim 15 wherein
the step of determining uses a window comparator having two inputs, one output and a voltage threshold comprising a high voltage limit and a low voltage limit, wherein the output of the window comparator has a first state when both inputs have a voltage between the high voltage limit and the low voltage limit and a second state when one of the inputs has a voltage that is one of being above the high voltage limit and below the low voltage limit; and wherein
the step of configuring is performed when the window comparator outputs the first signal.

19. A method for reducing power dissipation in a double bridge amplifier as defined in claim 18 wherein the step of configuring further includes the steps of closing a first switch to connect the first load and the second load in series and setting a second switch that sets the third operational amplifier to ground potential.

20. A method for reducing power dissipation in a double bridge amplifier as defined claim 18 wherein the step of receiving two input signals further comprises the step of accepting output signals from the first operational amplifier and the second operational amplifier.

21. A self-configurable amplifier for driving a first load and a second load comprising:

a plurality of operational amplifiers; a plurality of connector elements between one of a load, an operational amplifier, a voltage source and a ground to one of another load, another operational amplifier, the voltage source and the ground; and a controller for operating the connector elements to create selectively a first configuration wherein the first load and the second load are connected in series by the connector elements, and two operational amplifiers drive the loads, and a second configuration wherein the first load is driven by two operational amplifiers and the second load is driven by two other operational amplifiers.

22. A self-configurable amplifier as defined in claim 21 wherein the connector elements include a plurality of resistances constructed and arranged to produce a feedback connection for each operational amplifier.

23. A self-configurable amplifier as defined in claim 22 wherein the controller includes a window comparator for controlling the connector elements, the connector elements further include a plurality of switches, and the window comparator has a high threshold voltage and a low threshold voltage, receives two inputs, and outputs a control signal to the switches.

24. A self-configurable amplifier as defined in claim 23 wherein one of the switches is a two-pole switch that selectively connects an operational amplifier to a feedback connection and to a ground in the first configuration and to a feedback connection and an amplifier input in the second configuration.

25. A self-configurable amplifier as defined in claim 23 wherein one of the switches selectively isolates the first load from the second load in the second configuration so that each load is driven independently by different operational amplifier.

26. A self-configurable amplifier as defined in claim 22 wherein the plurality of operational amplifiers includes a first operational amplifier, a second operational amplifier, a third operational amplifier and a fourth operational amplifier;

the connector elements include at least one feedback connection for each operational amplifier and a plurality of connections among the operational amplifiers, the loads and the controller; and the controller controls the connector elements so that the first configuration has the first operational amplifier and the second operational amplifier driving the first load and second load in series, and the second configuration has the first operational amplifier and the third operational amplifier driving the first load independently of the second operational amplifier and the fourth operational amplifier driving the second load.

27. A self-configurable amplifier for reducing power dissipation while driving a first load and a second load with a first signal and a second signal, respectively, the self-configurable amplifier comprising:

a first terminal that receives the first signal;

a second terminal that receives the second signal;

an amplifying circuit, coupled to the first and second terminals and the first and second loads, that drives the first load and the second load with the first signal and the second signal, respectively; and means, coupled to the first and second loads, for disconnecting the first and second loads from each other when at least one of the first and second signals are outside a voltage window defined by a first reference voltage and a second reference voltage, and connecting the first and second loads in series when the first and second signals are both within the voltage window so that power dissipation is reduced.

28. The self-configurable amplifier of claim 27, wherein the means for disconnecting and connecting is further coupled to the first and second terminals and the amplifying circuit, and includes:

means for configuring the self-configurable amplifier into two distinct bridge amplifiers, each distinct bridge amplifier driving one of the first and second loads when at least one of the first and second signals are outside the voltage window, and a single bridge amplifier driving the first and second loads connected in series when both of the first and second signals are within the voltage window.

29. The self-configurable amplifier of claim 28, wherein the means for configuring is coupled to the first and second terminals, and includes:

means for receiving a configuration signal and arranging the self-configurable amplifier into the two distinct bridge amplifiers when the configuration signal has a first state, and into the signal bridge amplifier when the configuration signal has a second state; and means for comparing each of the first and second signals to the voltage window, and for outputting the configuration signal having the first state when at least one of the first and second signals are outside the voltage window, and the second state when both of the first and second signals are within the voltage window.

30. The self-configurable amplifier of claim 29, wherein the means for comparing and outputting is coupled to the first and second terminals, and includes:

a window comparator having a first reference input that receives the first reference voltage, a second reference input that receives the second reference voltage, a first signal input that receives the first signal, a second signal input that receives the second signal, and an output that outputs the configuration signal.

31. The self-configurable amplifier of claim 29, wherein the means for receiving and arranging is coupled to the first and second loads, and includes:

a plurality of switches that selectively disconnects the first and second loads when the configuration signal has the first state; and connects the first and second loads in series at a connection node, the connection node being coupled to a portion of the amplifying circuit, the portion operating as a buffer circuit to absorb a current difference between a first current flowing through the first load and a second current flowing through the second load when the configuration signal has the second state.

32. The self-configurable amplifier of claim 31, wherein the portion of the amplifying circuit includes:

grounding circuitry, coupled to the connection node, that grounds the connection node to a ground potential when configuration signal has the second state.

33. The self-configurable amplifier of claim 29, wherein the amplifying circuitry has deriving circuitry that derives a derived first signal from the first signal and a derived second signal from the second signal, and wherein the means for comparing and outputting is coupled to the deriving circuitry, and includes:

a window comparator having a first reference input that receives the first reference voltage;

a second reference input that receives the second reference voltage;

a first signal input that receives the derived first signal from the deriving circuitry;

a second signal input that receives the derived second signal from the deriving circuitry; and an output that outputs the configuration signal.

* * * * *

UNITED STATES PATENT AND TRADEMARK OFFICE
CERTIFICATE OF CORRECTION

PATENT NO. : 5,444,417
DATED : August 22, 1995
INVENTOR(S) : Edouardo BOTTI and Guido BRASCA It is certified that error appears in the above-indentified patent and that said Letters Patent is hereby corrected as shown below:

On the title page item [73], should read:

-- SGS-Thomson Microelectronics, S.r.l.
Via C. Olivetti, 2
Agrate Brianza, Italy --

Signed and Sealed this

Fifth Day of March, 1996

*Attest:*

BRUCE LEHMAN

*Attesting Officer*     *Commissioner of Patents and Trademarks*